United States Patent [19]

Helmer et al.

[11] Patent Number: 4,774,437

[45] Date of Patent: Sep. 27, 1988

[54] INVERTED RE-ENTRANT MAGNETRON ION SOURCE

[75] Inventors: John C. Helmer; Kenneth J. Doniger, both of Menlo Park, Calif.

[73] Assignee: Varian Associates, Inc., Palo Alto, Calif.

[21] Appl. No.: 835,072

[22] Filed: Feb. 28, 1986

[51] Int. Cl.[4] .................. C23C 14/36; H01J 27/02; H05H 1/00

[52] U.S. Cl. .............. 315/111.81; 313/230; 313/359.1; 313/160; 313/161; 313/614; 313/618; 313/231.41; 313/357; 315/111.41; 250/426; 204/298

[58] Field of Search ........... 315/32, 39, 39.51, 39.59, 315/39.67, 39.71, 111.41, 111.81; 313/364, 440, 442, 346 R, 567, 230, 359.1, 231.41, 231.31, 614, 618, 357; 250/423 R, 423 F, 426; 204/298

[56] References Cited

U.S. PATENT DOCUMENTS

| | | | |
|---|---|---|---|
| 3,458,755 | 7/1969 | Staats | 315/39.51 |
| 4,116,791 | 9/1978 | Zega | 204/298 X |
| 4,139,772 | 2/1979 | Williams | 250/426 |
| 4,164,684 | 8/1979 | Oguro | 315/39.51 |
| 4,253,038 | 2/1981 | Hosoya et al. | 313/161 X |
| 4,366,418 | 12/1982 | Mayama et al. | 315/111.81 |
| 4,377,773 | 3/1983 | Hershcovitch et al. | 204/298 |
| 4,407,713 | 10/1983 | Zega | 204/298 X |
| 4,423,355 | 12/1983 | Kageyama | 315/111.81 |
| 4,426,275 | 6/1984 | Meckel | 204/298 |
| 4,446,403 | 5/1984 | Cuomo et al. | 250/426 X |
| 4,525,262 | 6/1985 | Class et al. | 204/298 X |
| 4,525,264 | 6/1985 | Hoffman | 204/298 |
| 4,542,321 | 9/1985 | Singh et al. | 315/111.81 |

OTHER PUBLICATIONS

"High Rate Sputtering with a Torus Plasmatron", Proc. 7th Intl. Sym. Electron and Ion Beam Science and Tech., Wash. D.C., 1976, p. 129.
Heisig et al., "High-Rate Sputtering with a Torus Plasmatron", pp. 129–141.
Waits, "Planar Magnetron Sputtering", JVST 15(2), Mar./Apr. 1978, pp. 179–187.
Thornton, "Magnetron Sputtering", JVST 15(2), Mar./Apr. 1978, pp. 171–177.
Hosokawa et al., "Ion Analysis in High Rate Coaxial Cylindrical Magnetron Sputtering", Proceedings of the Symposium on Ion Sources and Application Technology, Feb. 14–15, 1977; Institute of Electrical Engineers of Japan, pp. 115–116.

*Primary Examiner*—David K. Moore
*Assistant Examiner*—Mark R. Powell
*Attorney, Agent, or Firm*—Stanley Z. Cole; Kenneth L. Warsh; Peter J. Sgarbossa

[57] ABSTRACT

An ion source for an intense ion beam from a solid source is formed with a cathode around a central anode. A source of magnetic field with closely spaced poles is formed around a central region of the cathode so that the most intense region of the magnetic field is a torus on the inside of the cathode and the field at the anode is weak. A torus of plasma can be formed near the inside surface of the cathode which can be coated with solid source material. An ion beam can be extracted through an aperture in the cathode.

14 Claims, 3 Drawing Sheets

INVERTED RE-ENTRANT MAGNETRON ION SOURCE

FIELD OF THE INVENTION

This invention pertains to an apparatus for producing a beam of charged ions and in particular to an ion source using a magnetron with the cathode enclosing the anode.

BACKGROUND OF THE INVENTION

Ion sources of the prior art generally use a filament-heated cathode to strike a low voltage discharge in a gas introduced into the source. Solid deposits from the gas contaminate the chamber and occlude the ion aperture. The filaments have a short life and the gases are often toxic. Toxic gases require special handling and pumping. It would be desirable to have an ion source in which there is no filament to burn out and in which the source material can be incorporated as a solid to eliminate the problems of toxic gases, and which is self-cleaning.

A planar magnetron has a plane cathode sheet over which there is a re-entrant magnetic field pattern formed by lines of north and south poles placed under the sheet. (See Waits, "Planar Magnetron Sputtering", JVST 15 (2), p. 179, March/April 1978.) Typically the north pole is a ring concentric with a south pole ring parallel to the plane of the cathode. The magnetic field which loops above the cathode forms a "racetrack" which traps an intense donut-shaped discharge, anchored to the cathode, analogous to the negative glow in a discharge between parallel plates when B=0. Primary electrons are released from the cathode by ion bombardment and give up their energy in the negative glow. A weaker glow which pervades the external space, like a positive column, connects the negative glow of the donut to an anode of arbitrary location. Above a pressure of about 1 mTorr, the planar magnetron behaves approximately as a glow discharge with a fixed voltage of about 400 volts in argon and unlimited current density. Most of the cathode current is carried by ions. Substantially all of the discharge voltage appears across a thin sheath between the negative glow and the cathode. The thickness of the cathode sheath is believed to be governed by Child's law for space charge limited emission. Thus, for a current density J, discharge voltage V, and sheath thickness x $$J = \frac{5.45 \times 10^{-8}}{M^{1/2}} \cdot \frac{V^{3/2}}{x^2}$$

amps per unit area (in units of $x^2$), for singly charge ions of atomic weight M. If V=400 volts, M=40 (argon) and x=1 mm, we get J=7 ma/cm$^2$. Experimentally, a value of J=100 ma/cm$^2$ is easy to obtain, and we expect a sheath thickness of a fraction of a millimeter. (See Thornton, "Magnetron Sputtering", JVST 15 (2), p. 171, March/April 1978; Green, "Intense Ion Beams", Rep. Prog. Phys. 37, p. 1257, 1974; Alton, "Aspects of the Physics . . . of Heavy Ion Sources", Nucl. Inst. Meth. 189 (15), p. 37, 1981.)

The planar magnetron is an important industrial device which has been subjected to little research; it is known to be stable and well-behaved at pressures of a few milliTorr, with capability for high discharge current density limited only by power dissipation.

In the publication of Heisig et al, "High Rate Sputtering With a Torous Plasmatron", Proc. 7th Intl. Sym. Electron and Ion Beam Science and Technology, Wash., D.C. 1976, Electrochemical Society, Princeton, NJ, 1976, pp. 129-141, a sputter deposition source is described using a cylindrical inverted configuration.

U.S. Pat. No. 4,542,321 to Singh et al discloses an inverted magnetron ion source in which the lines of magnetic flux extend through a cylinder cathode from one end to the other. This device does not concentrate the plasma enough to form an intense ion beam.

OBJECTS OF THE INVENTION

It is an object of the invention to obtain an intense ion source in which there is no heated filament.

It is a further object of the invention to obtain an intense ion source in which the beam ions can be supplied from a solid source rather than a gas.

SUMMARY OF THE INVENTION

These objects of the invention and other objects, features and advantages to become apparent as the specification progresses are accomplished by the invention, according to which, briefly stated, a planar magnetron type of discharge is used, for example, in a cylindrical geometry with an aperture cut in the cylinder for ion extraction. In another embodiment preferred for some applications, the cylindrical geometry can be changed to rectangular. The new ion source differs from other magnetron type devices in that the potentials are reversed, the magnetic field is strongly re-entrant on a narrow region of the cathode, and there is no hot filament. Solid source materials can be plated on the cathode such that the discharge becomes self-sustaining in its own cathode vapor.

In the strong region of the discharge an intense flux of ions is incident upon the cathode surface. This ion flux has three important uses: (a) ions of the support gas can be extracted to make an ion beam, as when the gas feed to the discharge contains the atom of use; (b) the 400 volt ion flux of the support gas may release copious atoms of the solid line by sputtering, which are then ionized in the discharge to form the desired ion beam; (c) the 400 volt sputtering effect of the ion flux exerts a self-cleaning action on the chamber wall and ion aperture.

These and further constructional and operational characteristics of the invention will be more evident from the detailed description given hereinafter with reference to the figures of the accompanying drawings which illustrate preferred embodiments and alternatives by way of non-limiting examples.

DESCRIPTION OF THE PREFERRED EMBODIMENTS

Figure 1:
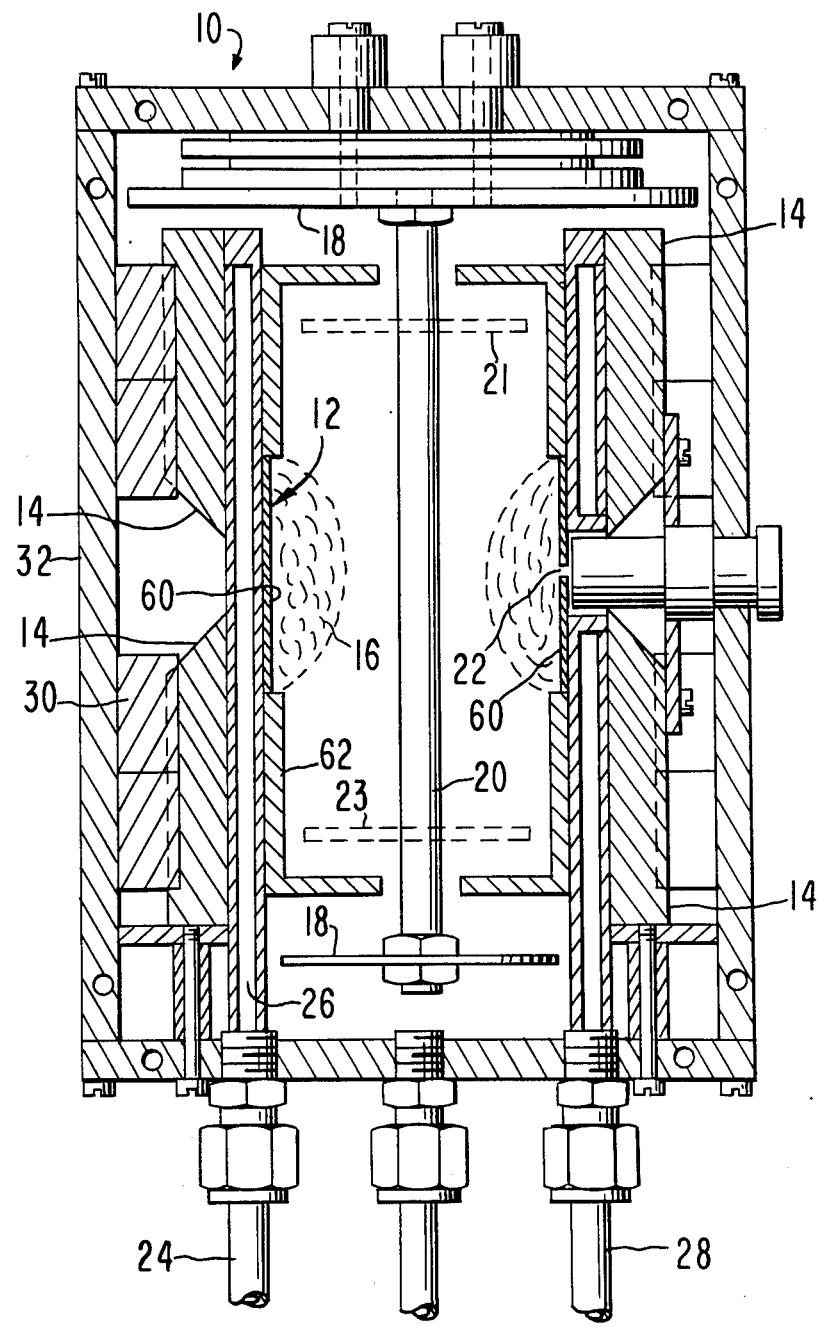
FIG. 1 is a sectional view from the side of a cylindrical ion source according to the invention.

Referring now to the drawings wherein reference numerals are used to designate parts throughout the various figures thereof, there is shown in FIG. 1 a section view of the planar magnetron rolled into a cylindrical configuration 10 suitable for operation as an ion source. The same figure can also be interpreted as a sectional view of a rectangular geometry to be discussed later. A magnetic field strength of about 200 gauss appears parallel to the cathode 12 midway between the pole pieces 14. In this region an intense, donut-shaped negative glow 16 should form with a radial thickness of about 1 cm. The axial length is controlled by the magnetic gap width. A cathode 12, cylinder diameter of about 3 cm, may be sufficient to form the discharge. The radial dimensions are governed by an electron cycloid diameter of about 1 cm for a 400 eV primary electron in a field of 200 gauss. The cathode cylinder 12 is terminated outside of the re-entrant magnetic field by anode end caps 18. An axial anode 20 extends down the center of the ion source.

In general, the dimensions of the source scale to the magnetic gap size used. For example, the inside diameter could be about 3 gap widths and the inside length could be about 4 gap widths. The diameter of the anode, if in the form of a rod down the center, should be very small compared to the inside diameter of the source.

In an alternate embodiment, the axial anode 20 can be eliminated and the anode formed as plates 21 or 23 (shown in dotted lines) or both. The shape of the anode is not critical, but it must be outside the region of intense magnetic field.

Ions are extracted from an aperture 22 cut in the cathode 12. The ions, originating in a cathode sheath of thickness x, exit the cathode with an energy of 400 eV. Then they are accelerated to a final energy of $eV_o$ by an electrode spaced a distance d from the cathode. According to present concepts, the extraction fields should form an analytic continuation of the space charge limited fields in a flat cathode sheath. If not, the beam will be severely defocussed and dissipated. The entire region of extraction is governed by Child's law. If $V_g=400$ volts is the discharge voltage, then to transport a constant current we require that:

$$\frac{V_g^{3/2}}{x^2} = \frac{V_o^{3/2}}{(x+d)^2}, \text{ or } \frac{d}{x} = \left(\frac{V_0}{V_g}\right)^{3/4} - 1.$$

Thus, the spacing of the extraction electrodes is given in terms of the sheath thickness which is a function of the ion current density J, and the operating voltages.

The cathode 12 is formed as a double-walled cylinder so that cooling water can be circulated from an inlet 24, through a hollow jacket 26, and through an outlet 28.

Permanent magnets 30 are mounted outside the pole pieces 14. The tips of the pole pieces 14 are tapered toward the region of the plasma to direct the lines of magnetic field. An outer jacket 32 of magnetic material forms a magnetic shield and serves as a yoke for the magnetic field.

Figure 2:
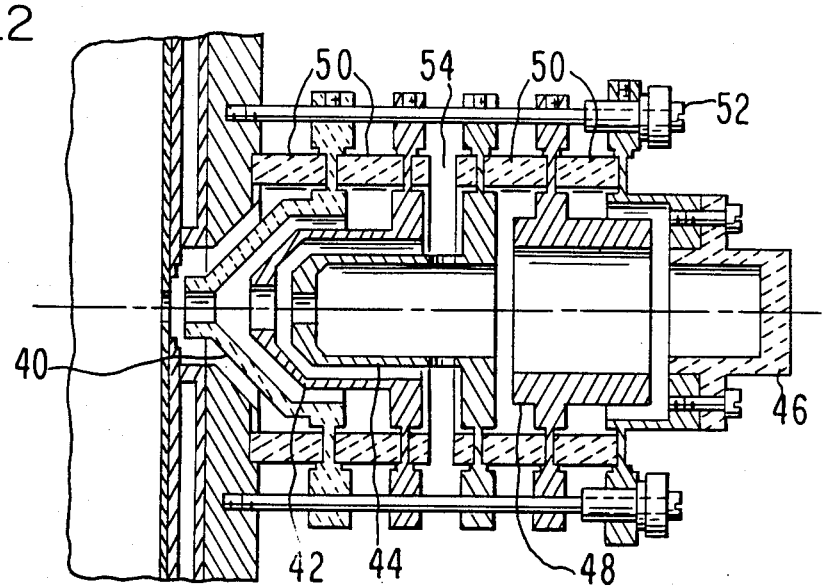
FIG. 2 is an enlarged view of the beam extraction arrangement of the device of FIG. 1.
Figure 3:
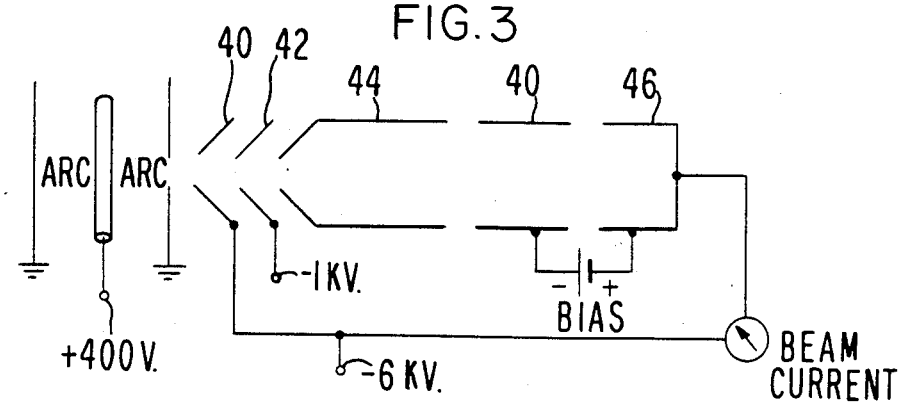
FIG. 3 is a schematic view of the apparatus of the invention in a rectangular embodiment.

The arrangement for the extraction of the beam is shown in FIG. 2. The discharge chamber is grounded. An extractor electrode 40 is formed of graphite and operated at −6 Kv. Electrodes 40, 42 and 44 form an einzel lens. Third electrode 44 is connected to extractor electrode 40, and a voltage of −1 Kv is applied to the einzel electrode 42. A Faraday cup 46 operated at −6 Kv is used to measure currents. A suppressor electrode 48 is placed in front of the Faraday cup to suppress electrons from the Faraday cup and operated at a few volts below the Faraday cup 46. Ceramic rings 50 and bolts 52 are used to space and hold the electrodes. Pumpout holes 54 are needed at intervals to remove gases. An electrical schematic of the extraction arrangement is shown in FIG. 3. Adjustment of both the voltage on the einzel 42 and the arc current in the magnetron ion source is necessary to obtain optimum focussing. Then the extractor current is less than the beam current and there is practically no current on the third electrode. Under these conditions beam current is proportionate to extraction voltage to the 3/2 power and arc current is proportionate to beam current. The entire arrangement is enclosed in a vacuum chamber (not shown).

To accommodate the extraction electrode system, the gap between the pole pieces was made about 0.7 inch. The beam aperture was made 0.2 inches diameter which corresponds to an area of about 1/5 cm$^2$. Thus, a beam current of 1 ma at 6 Kv represents a density at the aperture of 5 ma/cm$^2$. If current is proportioned to voltage to the 3/2 power, than an extraction voltage of 15 Kv will give an ion current density of 20 ma/cm$^2$ at an arc current of 2.4 A.

Figure 5:
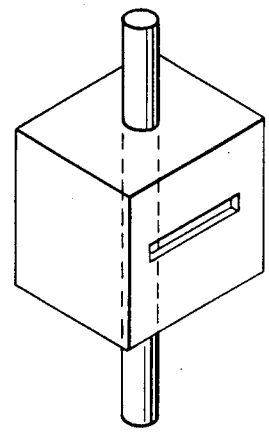
FIG. 5 is a perspective of a cell according to the invention in a rectangular embodiment.

For some applications such as ion implantation in semiconductors, a slit-shaped aperture is needed, about 3 mm wide × 3 cm long. To maintain high ion current density per ampere of arc current it is necessary to align the slit parallel to the edges of the pole pieces normal to the magnetic flux to retain a narrow magnetic gap. With a cylindrical source as previously described, the slit would have the curvature of the wall which tends to cause rapid beam divergence in the wide direction. As it may be difficult to focus divergence in the wide direction, it is convenient to use a cell of rectangular cross-section so that the slit may lie in a flat wall, as shown in FIG. 5.

Figure 4:
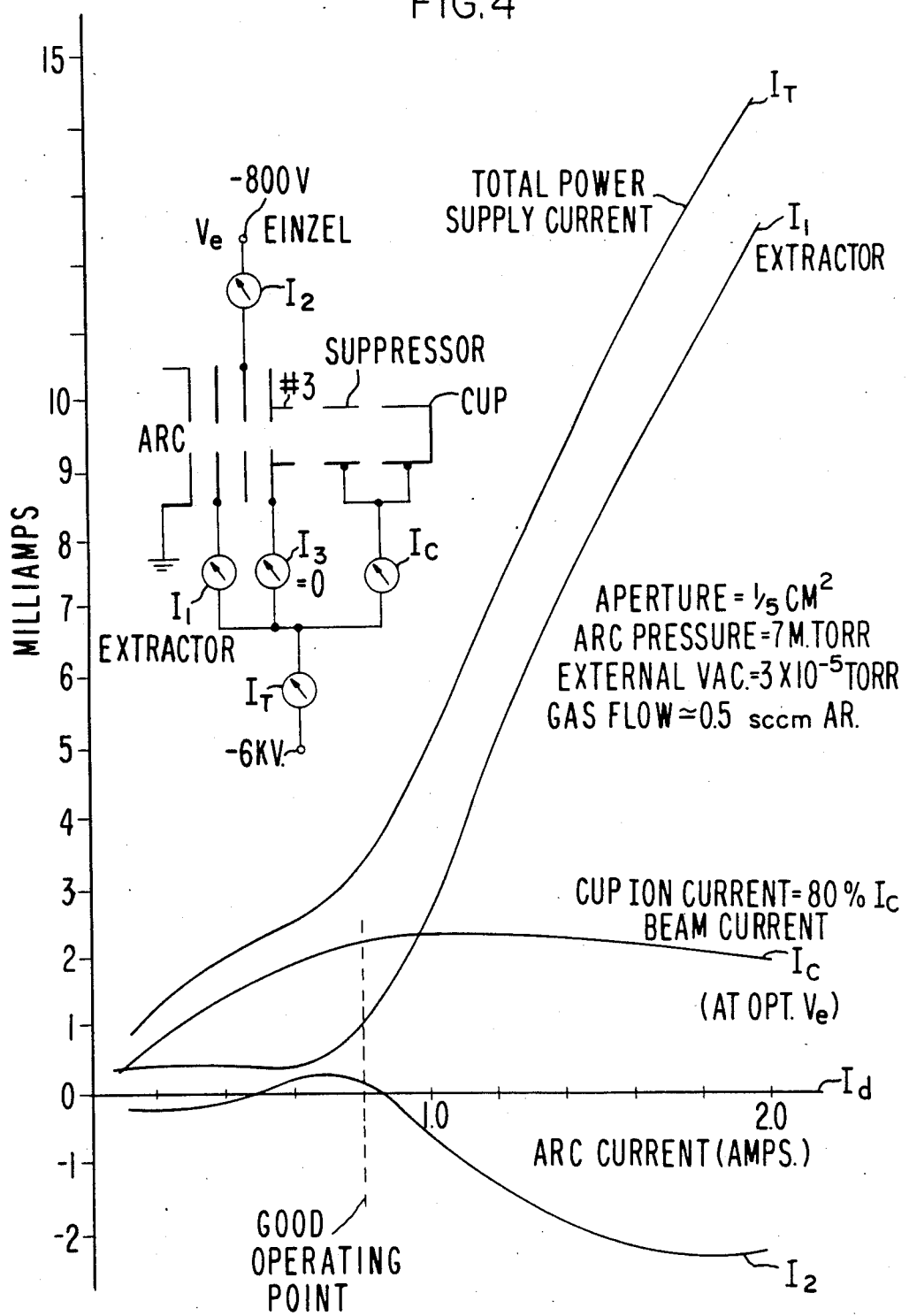
FIG. 4 is a graph of extracted current versus arc current for a test of the invention.

The currents to the beam forming electrodes in tests of the cylindrical embodiment are shown in FIG. 4 as a function of arc current. The arc is matched at 0.8 amps with most of the extracted current going into the beam.

Various cathode liners 60 may be used to extract different ion beams. A discharge limiting liner 62 of graphite can be used to further confine the discharge. For example, a boron-carbide liner can be used to extract a boron ion beam, or an aluminum liner may be used to extract an aluminum ion beam. If ions of the feed gas are only of interest, the chamber may be lined with graphite which has a low sputtering yield.

This invention is uniquely suitable for generating an ion beam from solid materials. However, its desirable properties are also achieved using suitable gases as beam material sources. When a gaseous source is used the magnetron ion source is preferably lined with graphite or titanium which has a low sputtering yield.

This invention is not limited to the preferred embodiments and alternatives heretofore described, to which variations and improvements may be made including mechanically and electrically equivalent modifications, changes and adaptations to component parts, without departing from the scope of production of the present patent and true spirit of the invention, the characteristics of which are summarized in the appended claims.

What is claimed is:

1. An ion beam source comprising:
    a chamber having an interior capable of being evacuated, said chamber having an axis which passes through said interior;
    a cathode within said chamber, said cathode surrounding but not intersecting said axis, said cathode having an aperture for passing an ion beam;
    a means for inducing a sharply reentrant magnetic field on said cathode, said magnetic field being concentrated at said cathode in a region adjacent said aperture and weak at said axis;
    anode means located outside concentrated regions of said magnetic field for imposing an electric potential; and
    means for extracting said ion beam through said aperture and for focusing said ion beam.

2. An ion beam source as in claim 1 wherein said anode means includes a conductor lying on said axis.

3. An ion beam source as in claim 1 wherein said anode means is a planar conductive surface intersecting said axis.

4. An ion beam source as in claim 1 wherein said cathode is a cylindrical ring centered on said axis.

5. An ion beam source as in claim 4 wherein said anode means includes a conducting rod lying on said axis, first and second conducting plates centered on said axis and connected to said conducting rod, said first and second conducting plates being located on opposite sides of said means for inducing a sharply reentrant magnetic field.

6. An ion beam source as in claim 1 wherein said cathode is a ring formed by joining four rectangular plates at their edges.

7. An ion beam source as in claim 6 wherein said anode means includes a conducting rod lying on said axis, first and second conducting plates centered on said axis and connected to said conducting rod, said first and second conducting plates being located on opposite sides of said means for inducing a sharply reentrant magnetic field.

8. A source of charged particles as in any one of claims 1-7 including a cathode liner of material which includes atoms of the beam desired.

9. An ion beam source as in claim 1 wherein said means for inducing a sharply reentrant magnetic field on said cathode comprises a first and a second magnetic pole piece located adjacent to and exteriorly of said cathode surrounding said axis, said first and said second pole pieces being separated by a selected gap, said aperture being adjacent said gap.

10. An ion beam source as in claim 9 wherein each of said first and said second pole pieces tapers inwardly toward said cathode to form said gap.

11. An ion source as in claim 9 wherein said means for extracting and for focusing is positioned in said selected gap adjacent said aperture.

12. An ion beam source as in claim 9 further including a member of magnetic material surrounding said first and second pole pieces, for forming a magnetic shield.

13. An ion beam source as in claim 1 wherein the dimension of the region surrounded by said cathode along an axis perpendicular to said axis is approximately three times the width of said gap.

14. A ion beam source, comprising:
    a cathode formed as a conductor generally closed about a hollow interior but having an opening at an end, said cathode having aperture means for passing an ion beam;
    an anode extending from outside said cathode through said opening into said hollow interior, said anode being generally centered in said hollow interior;
    means for producing a magnetic field with lines linking inwardly through said cathode into said hollow interior, said means for producing extending around a periphery of said cathode, said aperture means being located on said periphery, said magnetic field being concentrated in a region adjacent said aperture; and
    extraction means outside said cathode for extracting an ion beam through said aperture means.

* * * * *